(12) United States Patent
Edwards et al.

(10) Patent No.: US 8,525,520 B2
(45) Date of Patent: Sep. 3, 2013

(54) SYSTEM AND METHOD FOR LOW BATTERY DETECTION

(75) Inventors: Bruce Edwards, Johns Creek, GA (US); Eric Norrod, Cartersville, GA (US)

(73) Assignee: Landis+Gyr Innovations, Inc., Alpharetta, GA (US)

(*) Notice: Subject to any disclaimer, the term of this patent is extended or adjusted under 35 U.S.C. 154(b) by 760 days.

(21) Appl. No.: 12/787,912

(22) Filed: May 26, 2010

(65) Prior Publication Data

US 2011/0291660 A1    Dec. 1, 2011

(51) Int. Cl.
*G01N 27/416*  (2006.01)
*H02J 7/00*  (2006.01)

(52) U.S. Cl.
USPC .......... 324/429; 320/135; 320/136; 324/426; 324/432

(58) Field of Classification Search
USPC .................. 320/135, 136; 324/426, 429, 432
See application file for complete search history.

(56) References Cited

U.S. PATENT DOCUMENTS

| | | | |
|---|---|---|---|
| 3,946,299 A | 3/1976 | Christianson et al. | |
| 4,578,630 A | 3/1986 | Grosch | |
| 5,182,583 A * | 1/1993 | Horigome et al. | 347/19 |
| 5,387,228 A * | 2/1995 | Shelton | 607/11 |
| 5,528,149 A * | 6/1996 | Chen | 324/433 |
| 5,672,973 A * | 9/1997 | Arai et al. | 324/427 |
| 5,790,463 A | 8/1998 | Gilliam | |
| 5,959,851 A | 9/1999 | Shutts | |
| 6,737,671 B2 * | 5/2004 | Vollrath et al. | 257/48 |
| 6,759,832 B2 * | 7/2004 | Minamiura et al. | 320/150 |
| 6,768,288 B2 * | 7/2004 | Rosenquist et al. | 320/132 |
| 6,823,274 B2 * | 11/2004 | Zimmerman et al. | 702/63 |
| 7,218,118 B1 * | 5/2007 | Gonring | 324/429 |
| 7,411,515 B2 * | 8/2008 | Giger et al. | 340/636.19 |
| 7,505,856 B2 * | 3/2009 | Restaino et al. | 702/63 |
| 7,586,311 B2 * | 9/2009 | Nozaki et al. | 324/522 |
| 7,808,209 B2 * | 10/2010 | Fukute et al. | 320/132 |
| 8,004,243 B2 * | 8/2011 | Paryani et al. | 320/132 |
| 8,054,192 B2 * | 11/2011 | Grigsby et al. | 340/663 |
| 8,410,783 B2 * | 4/2013 | Staton | 324/433 |
| 8,415,926 B2 * | 4/2013 | Bhardwaj et al. | 320/134 |
| 8,427,166 B2 * | 4/2013 | Tsenter et al. | 324/426 |
| 2003/0030442 A1 * | 2/2003 | Sugimoto | 324/429 |

(Continued)

FOREIGN PATENT DOCUMENTS

| | | |
|---|---|---|
| JP | 9251063 | 9/1997 |
| WO | WO-2005076025 | 8/2005 |
| WO | 2011149928 | 12/2011 |

OTHER PUBLICATIONS

PCT/US2011/037727, International Search Report and Written Opinion, Sep. 9, 2011.

(Continued)

*Primary Examiner* — Drew A Dunn
*Assistant Examiner* — Michael Dibenedetto
(74) *Attorney, Agent, or Firm* — Kilpatrick Townsend & Stockton LLP

(57) ABSTRACT

Systems and methods for monitoring a voltage pump to determine the status of a battery connected to the voltage pump are provided. The operation of the voltage pump is monitored during at least one monitoring period which corresponds to a period of relatively heavy consistent load. The operation of the voltage pump can be monitored by sampling a control signal that corresponds to the operation of the voltage pump.

20 Claims, 4 Drawing Sheets

(56) References Cited

U.S. PATENT DOCUMENTS

| | | | |
|---|---|---|---|
| 2006/0091897 A1* | 5/2006 | Park | 324/756 |
| 2006/0244460 A1* | 11/2006 | Weaver | 324/430 |
| 2007/0090844 A1* | 4/2007 | Klang | 324/426 |
| 2008/0129248 A1* | 6/2008 | Hsu et al. | 320/136 |
| 2008/0164848 A1* | 7/2008 | Sakurai et al. | 320/136 |
| 2009/0251149 A1* | 10/2009 | Buckner et al. | 324/426 |
| 2009/0278506 A1* | 11/2009 | Winger et al. | 320/160 |
| 2010/0060238 A1* | 3/2010 | Chen et al. | 320/136 |
| 2010/0201196 A1* | 8/2010 | Spurlin et al. | 307/66 |
| 2012/0139500 A1* | 6/2012 | Ye et al. | 320/135 |

OTHER PUBLICATIONS

PCT/US2011/037727, "International Preliminary Report on Patentability", Dec. 6, 2012, 7 pages.

\* cited by examiner

SYSTEM AND METHOD FOR LOW BATTERY DETECTION

FIELD OF THE INVENTION

The present invention is related to determining battery status and in particular determining battery status by monitoring the operation of a voltage pump.

BACKGROUND

Battery-powered devices often monitor the status of the battery and indicate a low battery status as the battery approaches a fully discharged state, e.g., the end of its useful life. Devices known in the art to implement this monitoring capability include analog-to-digital converters ("A to D converters") and coulomb counters. An A to D converter typically measures the battery's voltage with a known load. As the battery approaches a fully discharged state, the battery's voltage decreases, and the battery's status is extrapolated based on the relationship between the known load and the measured voltage. However, many devices that require low battery detection capability do not include an A to D converter, and thus these solutions require additional components, which add to the cost and complexity of the device.

A coulomb counter measures the coulombs injected into a battery versus the coulombs taken out. This device measures 1) ambient temperature using a thermistor and (2) current through a shunt resistor. A microprocessor is also required to analyze the temperature and current data. The microprocessor typically utilizes a look-up table to determine how much energy has been consumed by the battery and to extrapolate the battery's status. Coulomb counters, like A to D converters, are not present in most battery-powered devices, and thus solutions that use coulomb counters require additional components, resulting in additional cost and complexity. One object of this invention is to monitor the status of a battery within a battery-powered device, without using an A to D converter or a coulomb counter.

As described above, known methods of monitoring a battery's status may require the installation of additional components. While many battery-powered devices do not have an A to D converter or a coulomb counter, many include a microprocessor and a voltage pump. In some instances the microprocessor and the voltage pump are integrated into a single device. The voltage pump regulates the voltage output. As the battery approaches a fully discharged state, the voltage pump has to work harder to maintain the desired output voltage. Some voltage pumps use Pulse-Width Modulation (PWM), where the voltage pump is continuously operating, and the boost provided by the voltage pump is dependent upon the pulse width of a control signal to the voltage pump. Other voltage pumps are switched mode pumps that are switched on and off, where the boost provided by the voltage pump is dependent upon how often the voltage pump is on.

SUMMARY

The invention monitors a voltage pump to determine the status of a battery connected to the voltage pump. Since the voltage pump's operation changes as the battery discharges, the level of operation of the voltage pump can be used to determine the battery's status. In one aspect of the invention, the operation of the voltage pump is monitored during a monitoring period which corresponds to a period of relatively heavy consistent load. The operation of the voltage pump can be monitored by sampling a control signal that corresponds to the operation of the voltage pump.

In one aspect of the invention, the battery is connected to a switched mode voltage pump, which drives a variable load. The system monitors the operation of the voltage pump during a monitoring period, which corresponds to a period of relatively heavy consistent load. The system samples a control signal is sampled multiple times during the monitoring period. If the samples taken during the monitoring period indicate that the voltage pump is operating at a predetermined level, then the system analyzes at least one previously determined level of operation of the voltage pump for a previous monitoring period to determine the battery status.

In some systems, if a threshold number of samples taken during the monitoring period indicate that the voltage pump was on, then the system determines that the voltage pump was operating at the predetermined level. For example, a system can determine that the voltage pump was operating at the predetermined level if all of the samples taken during the monitoring period indicate that the voltage pump was on.

In some systems, a single monitoring period may be sufficient to determine the battery status. However, in other systems, the operation of the voltage pump is monitored over multiple monitoring periods to avoid the generation of a false low battery indicator. For example, if the battery is subjected to temperature variations, then monitoring the operation of the voltage pump over multiple monitoring periods avoids generating a low battery indicator when the battery is cold, but not low.

In some systems, the system keeps track of the operation of the voltage pump using a counter or an accumulator. The counter or accumulator is adjusted in one manner when the samples indicate that the voltage pump is operating at the predetermined level and is adjusted in an opposite manner when the samples indicate that the voltage pump is not operating at the predetermined level.

The monitoring of the voltage pump and the determination of a low battery status may be accomplished by having a microprocessor monitor a control signal that indicates whether the voltage pump is operating. In some systems, the method for monitoring and analyzing the operation of the voltage pump is implemented using code that is stored on a computer-readable medium and executed by the microprocessor.

Other features, advantages, and objects of the present invention will be apparent to those skilled in the art with reference to the remaining text and drawings of this application.

DETAILED DESCRIPTION

Embodiments of the present invention provide methods and systems for monitoring a voltage pump to determine the level of operation of the voltage pump. Since the operating level of the voltage pump increases as the battery discharges, the system can determine the battery status by analyzing the operation of the voltage pump. Briefly described, the invention monitors the operation of the voltage pump during at least one monitoring period that corresponds to a period of relatively heavy consistent load to determine the battery status. One advantage of some embodiments of the invention over the prior art is that they can be implemented using existing components.

Exemplary System

Figure 1:
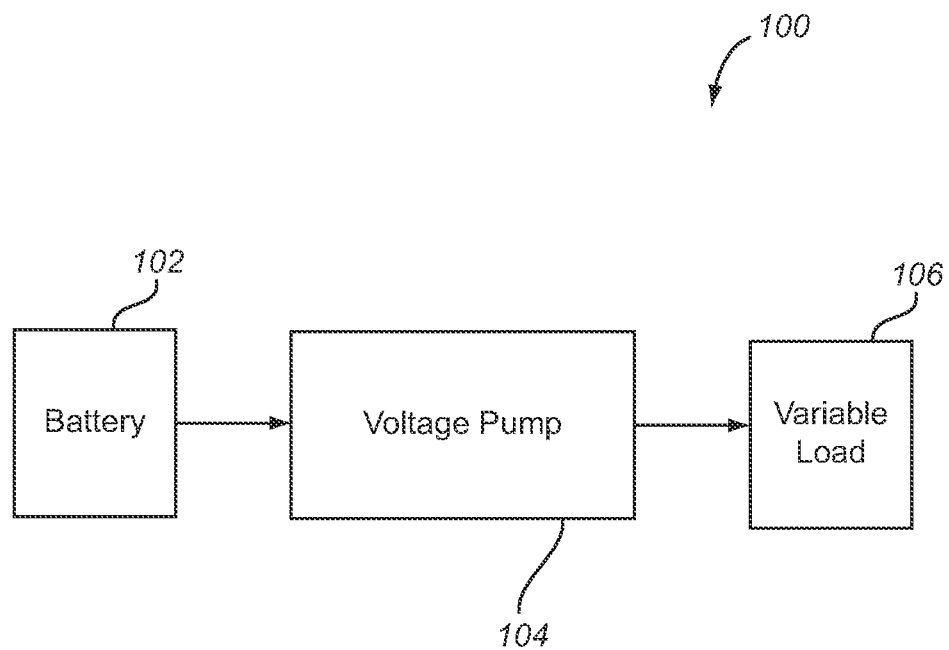
FIG. 1 is a block diagram illustrating the operating environment for an embodiment of the invention.

FIG. 1 illustrates an exemplary operating environment for some embodiments of the invention. A battery 102 powers a battery-powered device 100 (only a portion of which is shown in FIG. 1). The battery-powered device 100 includes a variable load 106. In some embodiments the load is associated with a device communicating via a network and in other embodiments the load is associated with a motor. However, these are only non-limiting examples and other types of loads also may be accommodated. A voltage pump 104 regulates the voltage at the variable load 106. As the battery discharges, the voltage pump operates at a higher level in order to maintain the output voltage. In one embodiment the battery is a 3V battery and the voltage pump is a switched mode voltage pump that boosts the voltage to 5V.

Figure 2:
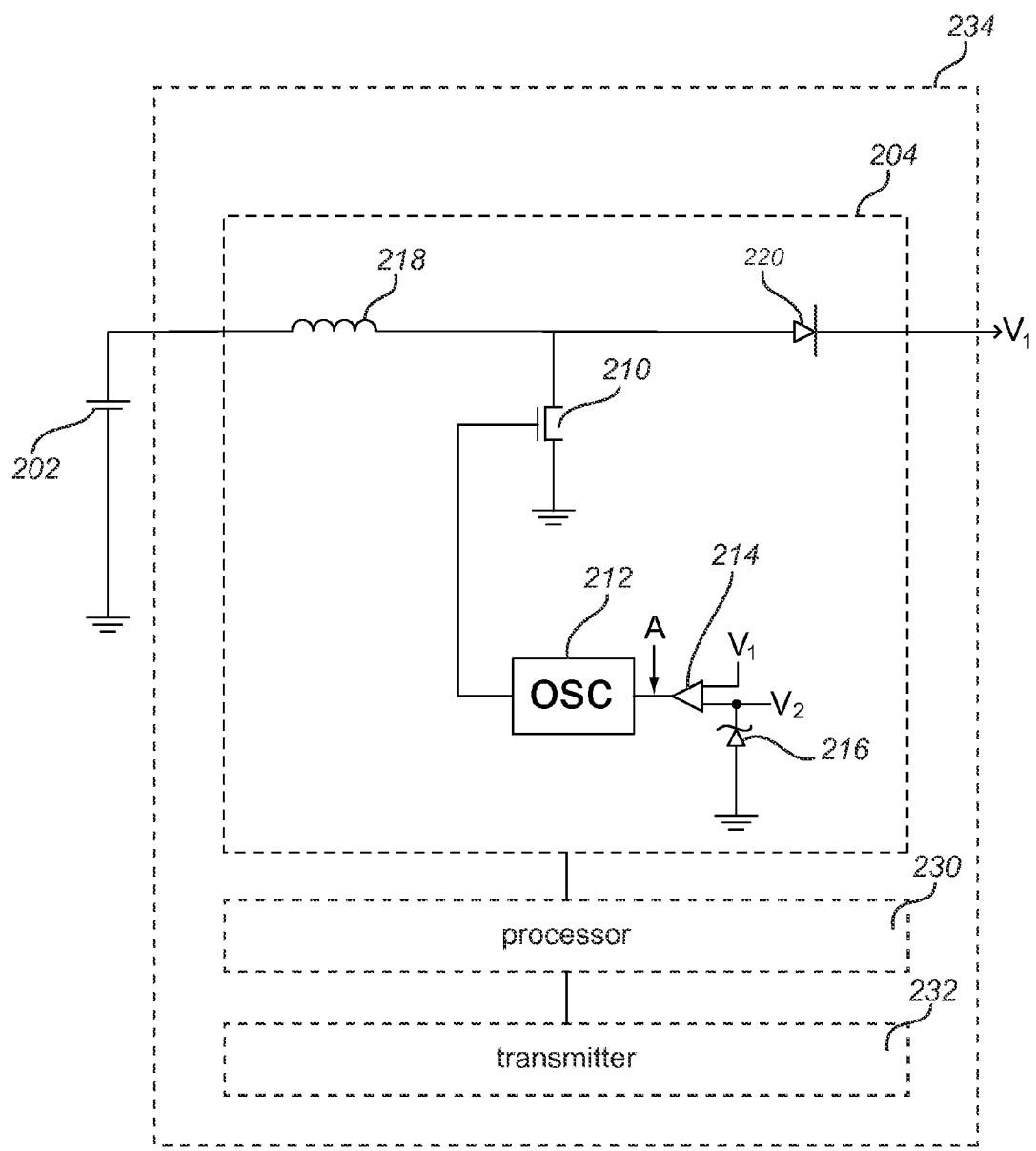
FIG. 2 is a block diagram illustrating additional details of the voltage pump of FIG. 1 in accordance with one embodiment of the invention.

FIG. 2 illustrates additional details of the voltage pump 204 and its connection to the battery 202. The voltage pump 204 is typical of those integrated with a microprocessor 230 or micro controller and available as a single device 234, such as those offered by Cypress Semiconductor. The integrated device may provide a transmitter 232, as well as additional components beyond those shown in FIG. 2 or described herein. The method of monitoring and analyzing the voltage pump to determine the battery status may be implemented in code that is stored in a computer-readable medium and is executed by a microprocessor. If the method is implemented using an integrated device, then the code may be stored in memory that is located in the same device as the microprocessor and the voltage pump.

The voltage pump 204 includes an oscillator 212, a comparator 214, a band-gap diode 216 and a switch 210. The inputs to the comparator are a voltage V1 that corresponds to the output voltage and a reference voltage, V2. The output of the comparator enables the oscillator. This signal is referred to herein as the control signal and is labeled as point A in FIG. 2. In one embodiment the oscillator is a square-wave oscillator operating at approximately 1.2 MHz. The oscillator controls the switch 210. The control signal indicates whether the voltage pump is operating. In the example illustrated in FIG. 2, the voltage pump also includes an inductor 218 and a diode 220. For example, in one embodiment, the voltage pump is operating when the control signal is high and off when the control signal is low. As will be apparent to those skilled in the art, the control signal may correspond to other points in the voltage pump or in any control logic controlling the voltage pump, so long as the control signal can indicate that the voltage pump is operating. In the case of a switched mode voltage pump, the control signal may indicate that the voltage pump is "on." In the case of a PWM voltage pump, the control signal may indicate the width of the pulse controlling the voltage pump. The system monitors the control signal over time in order to determine whether the voltage pump is on more than it was at a previous point when the battery was more fully charged. Once the system recognizes that the voltage pump is operating at a predetermined level that corresponds to a low battery status, the system indicates a low battery status.

Exemplary Methods of Operation

Figure 3:
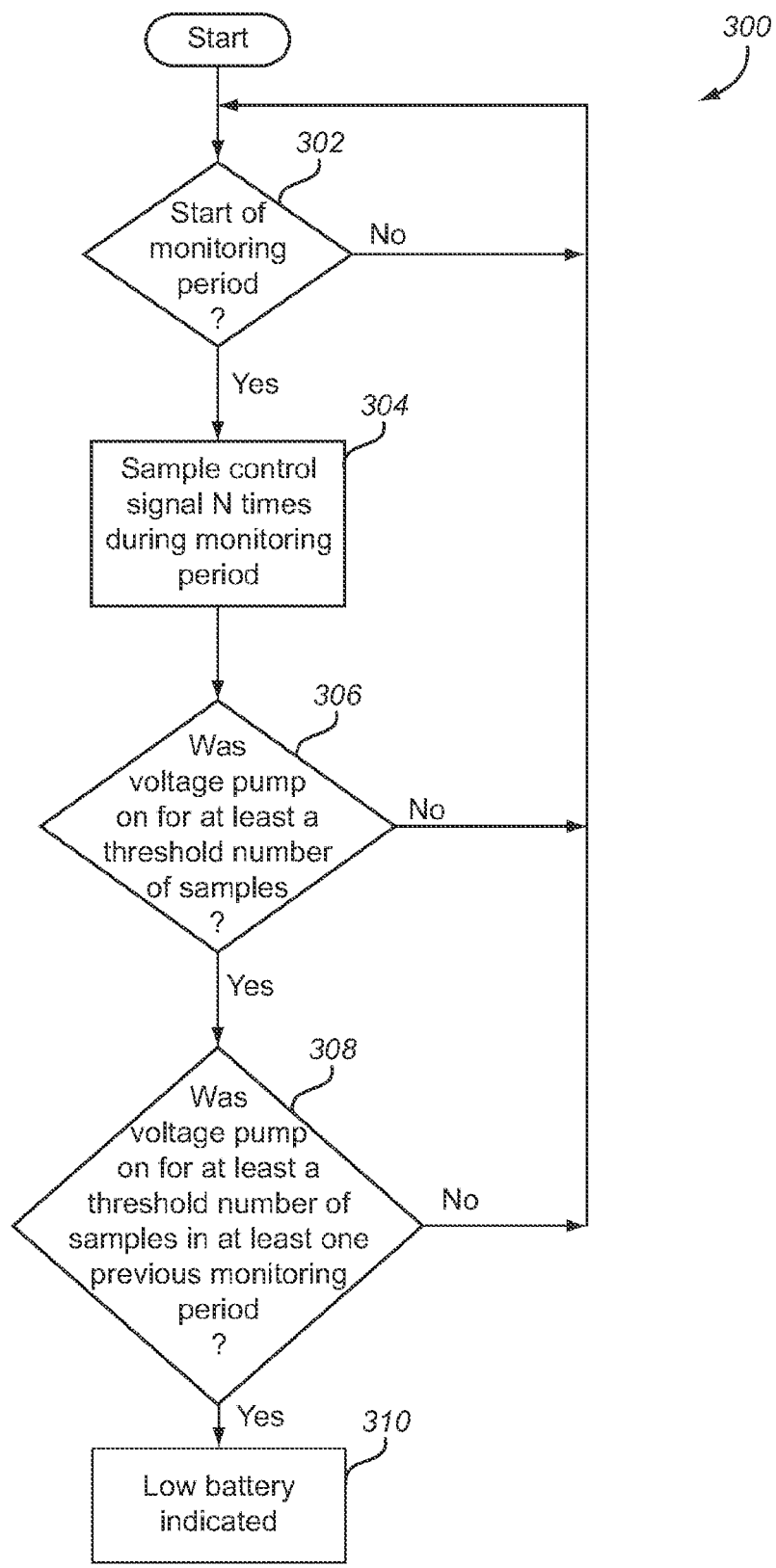
FIG. 3 is a flow diagram illustrating a method of detecting battery status in accordance with one embodiment of the invention.
Figure 4:
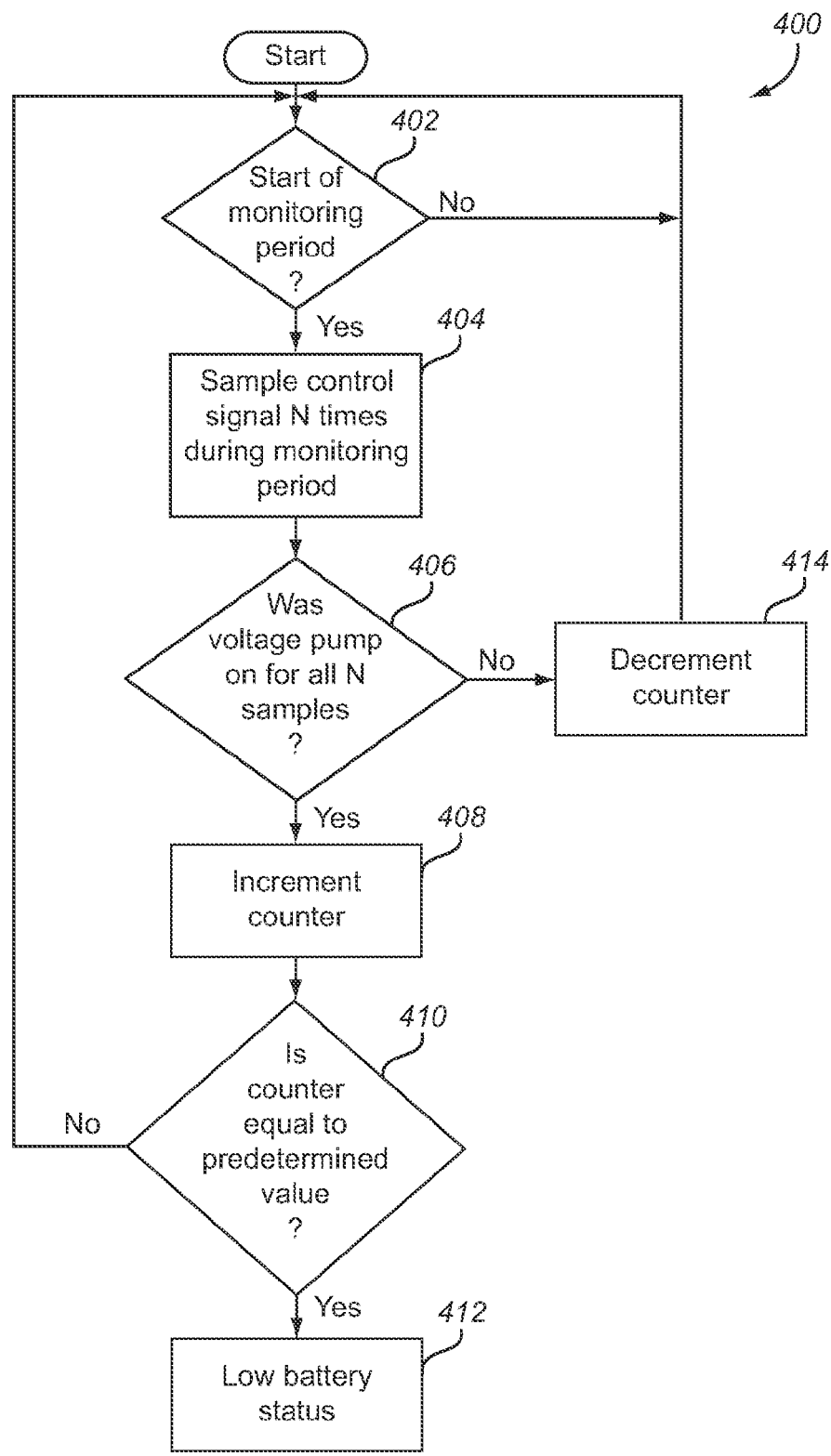
FIG. 4 is a flow diagram illustrating another method of detecting battery status in accordance with another embodiment of the invention.

FIGS. 3 and 4 illustrate exemplary methods of operation. In these embodiments, the battery may be connected to a switched mode voltage pump, which drives a variable load. The status of the battery is monitored by monitoring the operation of the voltage pump during a monitoring period. The monitoring period may correspond to a period of heavy consistent load so that the status of the battery can be accurately determined. In some embodiments, the monitoring period corresponds to a period of maximum sustained load.

For an embodiment where the battery is installed in a network device, the monitoring period may correspond to the time when the device is transmitting a portion of a message preamble since this corresponds to a period of maximum sustained load. In one exemplary implementation, the monitoring period does not start at the beginning of the message preamble due to in-rush current, but at a slightly later time, after the current has settled. In this manner, the operation of the voltage pump is monitored at a time when it is providing approximately constant current. For other embodiments, the monitoring period may correspond to other system activities, such as the operation of a motor.

The monitoring period may be defined prior to the start of the methods shown in FIGS. 3 and 4. If so, then the system recognizes when a monitoring period is about to begin. In one case where the monitoring period corresponds to a portion of the message preamble that follows the start of the preamble, the monitoring period begins after the first two bytes have been transmitted and continues while the next ten bytes are transmitted.

The voltage pump is monitored by sampling a control signal that indicates whether the voltage pump is on or off. In some embodiments the control signal corresponds to an enable line to an oscillator within the voltage pump. In this embodiment, the voltage pump is determined to be on when the control signal indicates that the oscillator is enabled. In other embodiments that use pulse width modulation, the control signal may correspond to the width of the pulse used to control the voltage pump. Other alternatives will be apparent to those skilled in the art.

The number of samples taken during each monitoring period may be predetermined and may be based on the operating characteristics of the system. In the example discussed above where the monitoring period corresponds to at least a portion of the message preamble, ten samples are taken during a monitoring period of approximately 4 ms. In some embodiments the samples may be taken periodically during the monitoring period. In other embodiments, the samples may be taken based on some other criteria, including a sample enable signal that may be based on system activity. In this case, there may be a different number of samples taken during different monitoring periods.

In some embodiments analyzing the samples from only a single monitoring period may be sufficient to determine the battery status. However, if the battery is subjected to temperature variation or other environmental variations that affects its performance, then multiple monitoring periods may be needed in order to avoid a false indication that the battery is low when it is not. For example, if the battery is installed in a system that is located outside and subject to temperature variations during the day, then multiple monitoring periods may be analyzed. In one implementation, monitoring periods that span a 12 hour period are analyzed. In this case, using a single monitoring period could result in a false low battery indication when the battery is cold, but not low.

FIG. 3 is a flow chart depicting the method of one embodiment of the invention. The method begins at block 302 where the method waits for the start of a monitoring period. If the start of a monitoring period has not yet begun, then the method follows the No branch from block 302 and continues to wait. If the start of a monitoring period has begun, then the method follows the Yes branch from block 302 to block 304. In block 304 the control signal is sampled N times during the monitoring period. The value of N may be predefined or may be determined for each monitoring period. The samples are processed in block 306 and a determination is made as to whether the samples indicate that the voltage pump was on for at least a threshold number of samples during the monitoring period. If the voltage pump was not on for at least the threshold number of samples during the monitoring period, then the voltage pump is determined not to be operating at a pre-determined level and the No branch is followed to block 302 and the method waits for the next monitoring period. In some embodiments the threshold number corresponds to all the samples, whereas in other embodiments the threshold number may correspond to a majority of the samples or to some other number that is less than all of the samples.

If the voltage pump was on for at least the threshold number of samples during the monitoring period, then the voltage pump is determined to be operating at the pre-determined level and the Yes branch is followed to block 308. In block 308, the operating level of the voltage pump for at least one previous monitoring period is considered. In some embodiments, the at least one previous monitoring period may include the immediately previous monitoring period, whereas in other embodiments the at least one previous monitoring period may include any of a number of previous monitoring periods. In some embodiments, the threshold number of samples used in each monitoring period is the same. However, other embodiments may use different numbers of samples in different monitoring periods.

If the voltage pump was on for at least a threshold number of samples in at least one previous monitoring period, then the Yes branch is followed to block 310 and a low battery status is indicated. The low battery status can be indicated in any of a number of different ways, including the activation of a low battery indicator or sending a message indicating the low battery status.

If analyzing the samples from only a single monitoring period is sufficient to determine the battery status, then the method proceeds from block 306 to 310 and block 308 is bypassed.

The method illustrated by FIG. 3 does not require any specific way of keeping track of the operating level of the voltage pump for each of the samples or each of the monitoring periods. FIG. 4 illustrates an exemplary embodiment, where a counter or an accumulator is used to keep track of the operation of the voltage pump.

The method begins at block 402 where the method waits for the start of a monitoring period. If the start of a monitoring period has not yet begun, then the method follows the No branch from block 402 and continues to wait. If the start of a monitoring period has begun, then the method follows the Yes branch from block 402 to block 404. In block 404 the control signal is sampled N times during the monitoring period. The samples are processed in block 406 and a determination is made as to whether the voltage pump was on for all of the samples during the monitoring period. If the voltage pump was not on for all of samples during the monitoring period, then the voltage pump is determined not to be operating at a pre-determined level and the No branch is followed to block 414 and the value in the counter or the accumulator is adjusted. In some embodiments, the value is decremented by one. Once the value in the counter or the accumulator has been adjusted, the method returns to block 402 and waits for the next monitoring period.

If the voltage pump was on for all of the samples during the monitoring period, then the voltage pump is determined to be operating at the pre-determined level and the Yes branch is followed from block 406 to block 408. In block 408, the value in the counter or accumulator is adjusted. In those embodiments where the value is decremented by one in block 414, the value may be incremented by one in block 408. After the adjustment, the value in the counter or the accumulator is compared to a predetermined value in block 410. If the value is not equal to the predetermined value, then the No branch is followed and the method returns to block 402 to wait for the next monitoring period. If the value is equal to the predetermined value, then the Yes branch is followed to block 412 and the status of the battery is determined to be low.

FIG. 4 illustrates an embodiment where the counter or accumulator is incremented or decremented based on all of the samples within a monitoring period and only a single battery status is determined per monitoring period. In other embodiments, the counter or accumulator could be incremented or decremented based on each sample. In these embodiments, different values of the counter or accumulator could correspond to different battery statuses and could be used to provide more information on battery status, such as the battery is approximately ½ full or the battery is approximately ¼ full, etc.

The definition of the monitoring period, the number of samples, when the samples are taken, the threshold number of samples, and the predetermined values may vary based on the design and operation of the battery-powered system, including the characteristics of the battery and voltage pump used. These values can be determined during a calibration cycle that is performed either prior to or after installation of the system.

Exemplary Implementation

Aspects of the invention can be further illustrated using an example where the battery-powered device is a remote node in a network that transmits a message approximately every 15 minutes. The monitoring period corresponds to a portion of the message preamble. The monitoring period starts after the first two bytes of the message preamble and continues for the next 10 bytes. The monitoring period is approximately 4 ms. In this example, the battery may be subjected to significant temperature variation during a 24 hour period. Extreme temperatures such as those found at about negative ten degrees Celsius (−10° C.) and below, impact the battery's performance, which in turn require that that the voltage pump work harder to maintain voltage regulation while the battery is cold, so multiple monitoring periods are used.

The system samples a control signal that enables an oscillator in the voltage pump. If all of the samples taken during a monitoring period indicate that the voltage pump is operating, then the value in a counter or accumulator is incremented. If at least one sample taken during a monitoring period indicates that the voltage pump is not operating, then the value in the counter or accumulator is decremented. In some implementations, the counter or accumulator is not allowed to go below zero. In these implementations, if the value is zero and it is determined that the value should be decremented, the value remains zero. Once the value in the counter or the accumulator exceeds 50, then the system determines that the battery status is low. Since the device sends a message every 15 minutes, the value of 50 represents that the voltage pump was operating at every sample point for approximately 12.5 hours. By monitoring the battery's performance over a period of at least twelve hours, sufficient time is allowed for the temperature to rise above the extreme temperature conditions that affect the battery's performance, thus preventing a false detection of a low battery condition.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application to enable others skilled in the art to utilize the invention and various embodiments and with various modifications as are suited to the particular use contemplated. Alternative embodiments will become apparent to those skilled in the art to which the present invention pertains without departing from its spirit and scope.

That which is claimed is:

1. A method of monitoring battery status, wherein the battery is connected to a voltage pump which drives a variable load, comprising:
    determining a start of a monitoring period to monitor the operation of the voltage pump;
    monitoring operation of the voltage pump during the monitoring period by sampling a control signal multiple times during the monitoring period, wherein the control signal indicates whether the voltage pump is on;
    if at least a pre-determined number of samples indicate that the voltage pump was on during each of the pre-determined number of samples, then determining that the voltage pump is operating at a pre-determined level; and
    when the voltage pump is operating at the pre-determined level, then analyzing at least one previously determined level of operation of the voltage pump for a previous monitoring period to determine the battery status.

2. The method of claim 1, wherein the monitoring period corresponds to a period of heavy consistent load.

3. The method of claim 2, wherein the period of heavy consistent load corresponds to the transmission of at least a portion of a message preamble in a wireless network.

4. The method of claim 3 wherein determining a start of a monitoring period comprises identifying the portion of the message preamble that corresponds to an approximately constant current at the variable load.

5. The method of claim 1, wherein the control signal indicates that an oscillator within the voltage pump is enabled.

6. The method of claim 1, wherein analyzing at least one previously determined level of operation of the voltage pump for a previous monitoring period to determine the status of the battery comprises:
    if the voltage pump was operating at the pre-determined level for a pre-determined number of previous monitoring periods, then determining that the battery status is low.

7. The method of claim 1, wherein the predetermined number of samples indicating that the voltage pump was on is equal to all the samples taken during the monitoring period.

8. A method of monitoring battery status, wherein the battery is connected to a voltage pump which drives a variable load, comprising:
    monitoring operation of the voltage pump during a monitoring period by sampling a control signal multiple times during the monitoring period, wherein the control signal indicates whether the voltage pump is on;
    processing the samples to determine if at least a pre-determined number of the samples taken during the monitoring period indicates that the voltage pump was on during each of the pre-determined number of samples to determine if the voltage pump is operating at a pre-determined level;
    when the voltage pump is operating at the pre-determined level, then adjusting a value representing the battery status; and
    if the value representing the battery status is at least equal to a pre-determined threshold, then determining that a low battery status exists.

9. The method of claim 8, further comprising:
    if the samples indicate that the voltage pump was not on for at least the pre-determined number of samples, then adjusting the value representing the battery status in a manner opposite that used when the voltage pump is operating at the pre-determined level.

10. The method of claim 8, further comprising:
    if the low battery status exists, then providing a notification indicating the low battery status.

11. The method of claim 8, wherein the monitoring period corresponds to a period of heavy consistent load.

12. The method of claim 11, wherein the period of heavy consistent load corresponds to the transmission of at least a portion of a message preamble in a wireless network.

13. The method of claim 8, wherein the control signal indicates that an oscillator within the voltage pump is enabled.

14. A battery monitoring system, comprising:
    a battery connected to a voltage pump;
    the voltage pump, which drives a variable load, wherein the voltage pump is switched on and off via a control signal; and
    a processor programmed to:
        monitor operation of the voltage pump by sampling the control signal multiple times during a monitoring period;
        if at least a pre-determined number of the samples taken during the monitoring period indicates that the voltage pump was on during each of the pre-determined number of samples, then determine that the voltage pump is operating at a pre-determined level; and
        when the voltage pump is operating at the pre-determined level, then analyzing at least one previously determined level of operation of the voltage pump for a previous monitoring period to determine the battery status.

15. The system of claim 14, wherein the voltage pump and the processor are integrated into a single device.

16. The system of claim 14, wherein the monitoring period corresponds to a period of heavy consistent load.

17. The system of claim 16, wherein the period of heavy consistent load corresponds to the transmission of at least a portion of a message preamble in a wireless network.

18. The system of claim 14, wherein the control signal indicates that an oscillator within the voltage pump is enabled.

19. The system of claim 14, wherein analyzing at least one previously determined level of operation of the voltage pump for a previous monitoring period to determine the status of the battery comprises:
    if the voltage pump was operating at the pre-determined level for a pre-determined number of previous monitoring periods, then determining that the battery status is low.

20. The system of claim 14, further comprising a transmitter for transmitting the battery status.

* * * * *